(12) United States Patent
Zhang et al.

(10) Patent No.: US 9,628,735 B2
(45) Date of Patent: Apr. 18, 2017

(54) IMAGING SYSTEMS WITH SINGLE-PHOTON-AVALANCHE-DIODES AND SENSOR TRANSLATION, AND ASSOCIATED METHODS

(71) Applicant: OmniVision Technologies, Inc., Santa Clara, CA (US)

(72) Inventors: Bowei Zhang, Fremont, CA (US); Ming-Kai Hsu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/745,954

(22) Filed: Jun. 22, 2015

(65) Prior Publication Data

US 2016/0373676 A1 Dec. 22, 2016

(51) Int. Cl.
*H04N 5/335* (2011.01)
*H04N 5/374* (2011.01)
*H04N 5/33* (2006.01)
*H04N 9/04* (2006.01)
*G06T 3/40* (2006.01)

(52) U.S. Cl.
CPC .......... *H04N 5/374* (2013.01); *G06T 3/4053* (2013.01); *H04N 5/332* (2013.01); *H04N 9/045* (2013.01)

(58) Field of Classification Search
CPC .................................................. H04N 5/374
USPC ......................................................... 348/308
See application file for complete search history.

(56) References Cited

U.S. PATENT DOCUMENTS

| | | | | |
|---|---|---|---|---|
| 2010/0020209 A1* | 1/2010 | Kim | ....................... | H04N 3/155 348/294 |
| 2014/0146207 A1* | 5/2014 | Yokogawa | ............. | H04N 5/374 348/281 |
| 2015/0115131 A1* | 4/2015 | Webster | ............ | H01L 27/14603 250/208.1 |

OTHER PUBLICATIONS

B&H Foto & Electronics Corp., Hasselblad H5D-200c Multi-Shot Medium Format DSLR Camera Body at http://www.bhphotovideo.com/c/product/1078381-REG/hasselblad_3013708_h5d_200c_ms_digital_camera.html; accessed on Apr. 27, 2015, 4 pages.
Kumar, Priyanka; Time-of-Flight 3D Imaging based on a SPAD-TDC Pixel Array in Standard 65 nm CMOS Technology; M.S. Thesis, Delft University of Technology, The Netherlands; Sep. 2011, 148 pages.

(Continued)

*Primary Examiner* — Usman Khan
(74) *Attorney, Agent, or Firm* — Lathrop & Gage LLP

(57) ABSTRACT

An imaging system with single-photon-avalanche-diodes (SPADs) and sensor translation for capturing a plurality of first images to enable generation of an enhanced-resolution image includes (a) an image sensor with SPAD pixels for capturing the plurality of first images at a plurality of spatially shifted positions of the image sensor, respectively, and (b) an actuator for translating the image sensor, parallel to its light receiving surface, to place the image sensor at the plurality of spatially shifted positions. A method for capturing a plurality of first images that enable composition of an enhanced-resolution image includes (a) translating an image sensor parallel to its light receiving surface to place the image sensor at a plurality of spatially shifted positions, and (b) capturing, using SPAD pixels implemented in pixel array of the image sensor, the plurality of first images at the plurality of spatially shifted positions, respectively.

20 Claims, 11 Drawing Sheets

(56) References Cited

OTHER PUBLICATIONS

Yang, et al., "Image Super-Resolution: Historical Overview and Future Challenges", from Super-Resolution Imaging, Sep. 28, 2010, pp. 3-35.
Taiwan Application No. 105118566, English translation of Office Action mailed Jan. 23, 2017, 8 pages.

* cited by examiner

IMAGING SYSTEMS WITH SINGLE-PHOTON-AVALANCHE-DIODES AND SENSOR TRANSLATION, AND ASSOCIATED METHODS

BACKGROUND

A single-photon-avalanche diode (SPAD) is a solid-state photodetector that is sensitive to single photons. A single photon incident on the SPAD generates a photo-induced carrier such as an electron. Due to a relatively high voltage bias across the SPAD, this photo-induced carrier triggers an avalanche of secondary carriers to produce an avalanche current pulse. The single photon incident on the SPAD is detected through detection of the avalanche current pulse. The SPAD enables determination of the arrival time of the single photon with an accuracy of about 10-100 picoseconds. The intensity of light incident on a SPAD may be derived from the rate of avalanche current pulses or from the number of avalanche current pulses detected over a period of time. SPADs are generally more light-sensitive than conventional image sensors such as charge-coupled device (CCD) sensors and complementary metal-oxide-semiconductor (CMOS) image sensors. SPAD-based image sensors are also shot-noise limited and achieve good signal-to-noise ratios even at high frame rates. Therefore, SPAD-based image sensors may operate at frame rates higher than those of CCD and CMOS image sensors.

Superresolution imaging is the art of enhancing resolution of an imaging system. In geometrical superresolution imaging, the resolution of an image sensor is enhanced. For example, the resolution of an image sensor may be enhanced beyond the actual pixel resolution of the image sensor. In one method, a single low-resolution image of a scene is post-processed to generate a superresolution image. This method utilizes interpolation between individual pixels to generate information at a resolution greater than the pixel resolution. In another method, several spatially shifted low-resolution images of a scene are combined to generate the superresolution image.

SUMMARY

In an embodiment, an imaging system has single-photon-avalanche-diodes and sensor translation for capturing a plurality of first images to enable generation of an enhanced-resolution image of a scene. The imaging system includes an image sensor with a pixel array that includes single-photon-avalanche-diode pixels for capturing the plurality of first images of the scene at a plurality of spatially shifted positions of the image sensor, respectively. The imaging system further includes an actuator for translating the image sensor, parallel to light receiving surface of the image sensor, to place the image sensor at the plurality of spatially shifted positions.

In an embodiment, a method for capturing a plurality of first images that enable composition of an enhanced-resolution image of a scene includes (a) translating an image sensor, parallel to light receiving surface of the image sensor, to place the image sensor at a plurality of spatially shifted positions; and (b) capturing, using single-photon-avalanche-diode pixels implemented in pixel array of the image sensor, the plurality of first images of the scene at the plurality of spatially shifted positions, respectively.

DETAILED DESCRIPTION OF THE EMBODIMENTS

Figure 1:
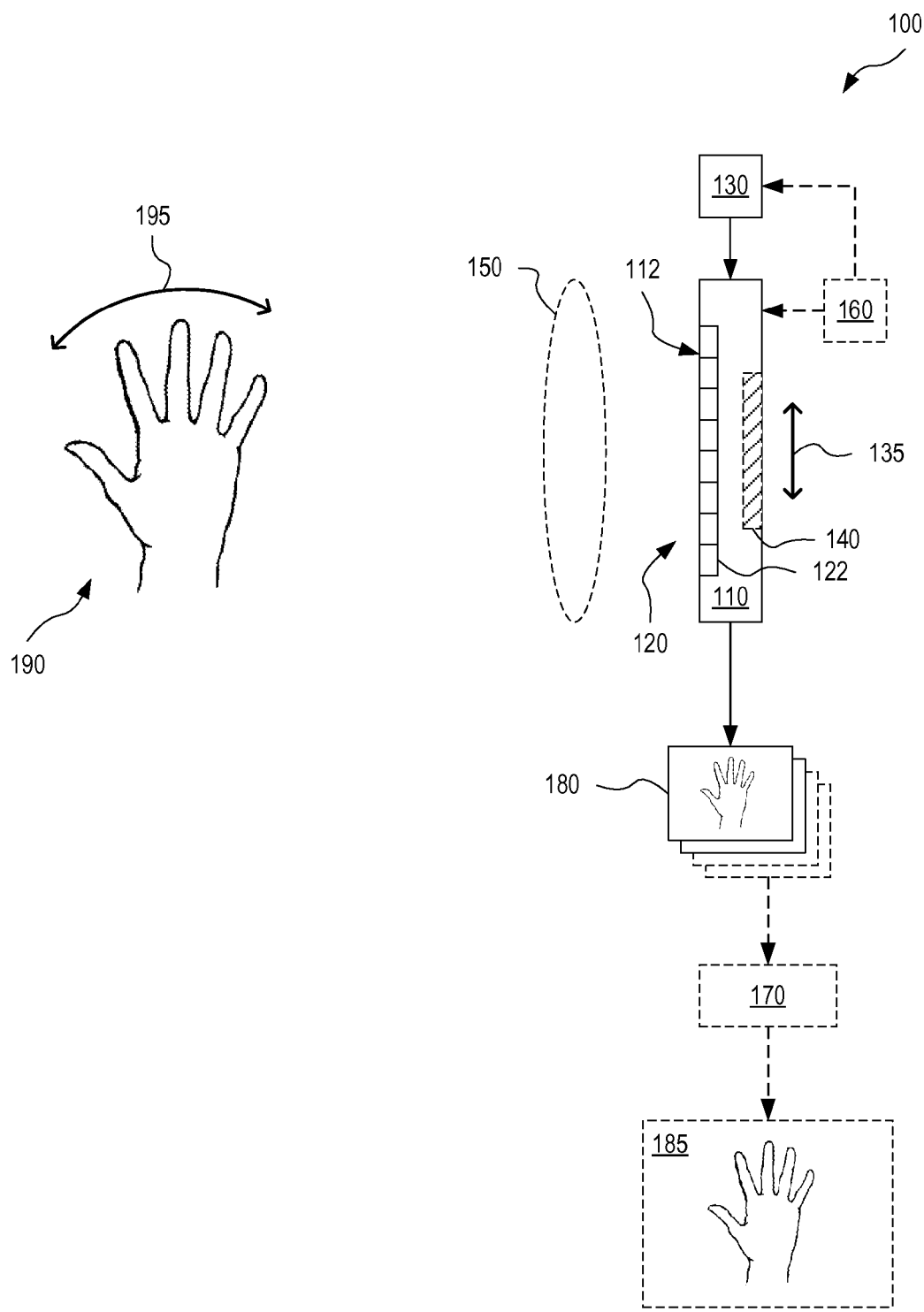
FIG. 1 illustrates an imaging system with single-photon-avalanche-diodes (SPADs) and sensor translation, according to an embodiment.

FIG. 1 illustrates one exemplary imaging system 100 with single-photon-avalanche-diodes (SPADs) and sensor translation. Imaging system 100 combines SPADs with sensor translation to provide imaging capability not achievable with image sensors such as conventional charge-coupled device (CCD) sensors and conventional complementary metal-oxide-semiconductor (CMOS) image sensors.

Imaging system 100 includes an image sensor 110 and an actuator 130 that translates image sensor 110 to place image sensor 110 in a plurality of spatially shifted locations. Image sensor 110 includes a photosensitive pixel array 120 with a plurality of photosensitive pixels 122. At least some of pixels 122 are SPAD pixels. Herein, a "SPAD pixel" refers to an image sensor pixel that includes a SPAD for detection of light. For clarity of illustration, not all pixels 122 are labeled in FIG. 1. In the scenario shown in FIG. 1, image sensor 110 captures an image of light incident on a light-receiving surface 112 of image sensor 110 from a scene 190. Optionally, imaging system 100 includes an imaging objective 150 that images scene 190 onto light receiving surface 112. Although shown in FIG. 1 as being a single lens, imaging objective 150 may include a plurality of lenses and/or one or more other optical elements, as known in the art, or imaging objective 150 may be lens-free imaging objective, without departing from the scope hereof. In an embodiment, image sensor 110 includes circuitry 140, coupled with pixel array 120, to read out signals from pixel array 120 so as to output images 180.

Actuator 130 is configured to translate image sensor 110 parallel to light-receiving surface 112. FIG. 1 indicates translation of image sensor 110 along a direction 135. However, actuator 130 may be configured to translate image sensor 110 in other directions that are parallel to light-receiving surface 112 and have a component orthogonal to the plane of the view of FIG. 1. In one embodiment, actuator 130 is configured to translate image sensor 110 along (a) a direction 135 and (b) a direction that is parallel to light-receiving surface 112 and orthogonal to direction 135. In another embodiment, actuator 130 is configured to translate image sensor 110 along two non-parallel directions, both of which are parallel to light-receiving surface 112.

In an embodiment, imaging system 100 includes a control module 160 that controls (a) translation of image sensor 110 by actuator 130 and (b) image capture or image readout by image sensor 110. Control module 160 may cooperate with circuitry 140 to control image capture or image readout by image sensor 110. Optionally, control module 160, or at least a portion thereof, is implemented within image sensor 110, for example integrated with circuitry 140. In an embodiment, imaging system 100 includes a processing module 170 that processes images 180 to compose enhanced-resolution image 185. Processing module 170 may utilize methods known in the art. In one implementation, processing module 170 is implemented within image sensor 110, for example integrated with circuitry 140. In another implementation, processing module 170 is implemented in a computer system external to image sensor 110.

Herein, "resolution" refers to pixel resolution of either a pixel array or of an image. In an example, the resolution of a pixel array, and an image 180 captured by the pixel array, is 800×600, while enhanced-resolution image 185 composed from a plurality of such images 180 may have resolution 1600×1200.

SPADs are very light-sensitive, operate in a photon counting regime as opposed to a light integration regime, and are at least nearly shot-noise limited. The readout of a SPAD is much faster than that of a pixel of a conventional CCD or CMOS image sensor. In an exemplary comparison, a conventional CCD or CMOS image sensor operates at a frame rate of about 30 to 60 frames per second, whereas, under the same conditions, a SPAD-based image sensor may operate at frame rates in excess of 10,000 frames per second. Hence, as compared to conventional CCD and CMOS image sensors, SPADs are better suited for low-light imaging and/or image capture at high frame rates. SPADs also provide accurate timing of light detection and are therefore well suited for time-of-flight imaging, for example as utilized in time-of-flight based three-dimensional imaging.

In low-light situations or when imaging moving objects, the relatively low frame rate associated with conventional CCD and CMOS image sensors precludes capture of multiple images to compose a superresolution image. However, since imaging system 100 utilizes SPADs, imaging system 100 may capture images 180 at a high frame rate, even under relatively low-light conditions. Therefore, imaging system 100 may apply superresolution imaging to low-light situations and moving objects.

SPAD pixels are often larger than pixels of a conventional CCD or CMOS image sensor. For this reason, SPAD-based time-of-flight image sensors (such as those used for time-of-flight based three-dimensional imaging) generally have lower resolution than conventional CCD and CMOS image sensors. Imaging system 100 utilizes sensor translation based superresolution imaging to overcome this problem, and thereby enables time-of-flight imaging at high spatial resolution.

Figure 2:
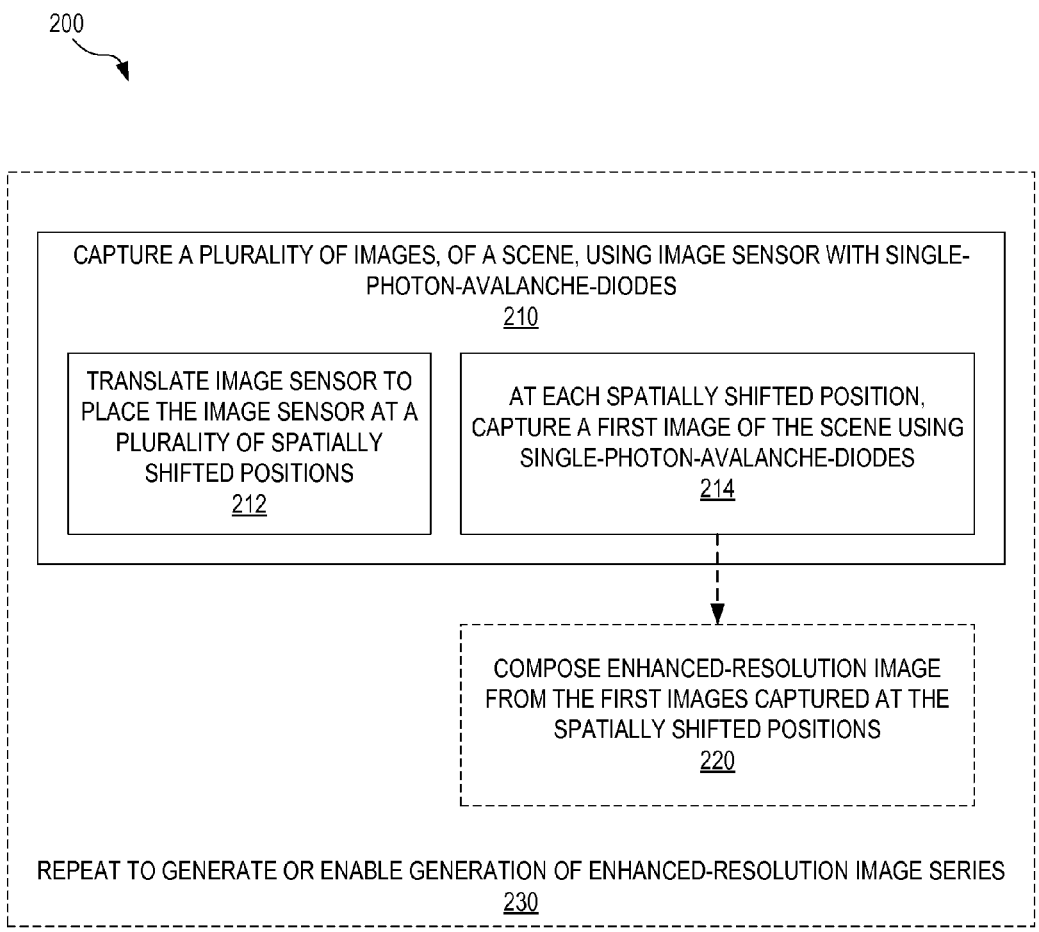
FIG. 2 illustrates a method for capturing images that enable composition of an enhanced-resolution image of a scene, according to an embodiment.

FIG. 2 illustrates one exemplary method 200 for capturing images that enable composition of an enhanced-resolution image of a scene. Method 200 is performed by imaging system 100, for example.

In a step 210, method 200 captures a plurality of images, of a scene, using an image sensor with SPAD pixels. Step 210 includes steps 212 and 214. In step 212, method 200 translates the image sensor to place the image sensor at a plurality of spatially shifted positions. In an embodiment, the spatially shifted positions include positions that are shifted from each other by less than the center-to-center distance between neighboring pixels of the image sensor. In step 214, method 200 captures a first image of the scene for each of the spatially shifted positions achieved in step 212. In one example of steps 212 and 214, actuator 130 translates images sensor 110, in one or more directions parallel to light-receiving surface 112, to place image sensor 110 in a plurality of spatially shifted positions. At each of these spatially shifted positions, image sensor 110 captures an image 180 of scene 190. Optionally, control module 160 controls translation by actuator 130 and image capture by image sensor 110, as discussed above in reference to FIG. 1.

In certain embodiments, method 200 further includes a step 220 of composing an enhanced-resolution image from the first images captured in step 214, wherein the enhanced-resolution image has resolution greater than the resolution of each of the first images. In one example of step 220, processing module 170 processes a plurality of images 180, captured in step 214 of scene 190, to compose enhanced-resolution image 185 of scene 190.

In one embodiment, method 200 includes a step 230 of repeating steps 210 and 220 to generate a stream of enhanced-resolution images such as a stream of enhanced-resolution images 185 of scene 190. In an alternative embodiment, step 230 omits step 220 and produces a stream of first images of the scene, captured in step 214, to enable generation of a stream of enhanced-resolution images from this stream of first images of the scene. In the scenario shown in FIG. 1, scene 190 is a hand moving along a direction 195. Step 230 may generate, or enable generation of, a stream of enhanced-resolution images 185 of the moving hand to facilitate gesture recognition.

Figure 3:
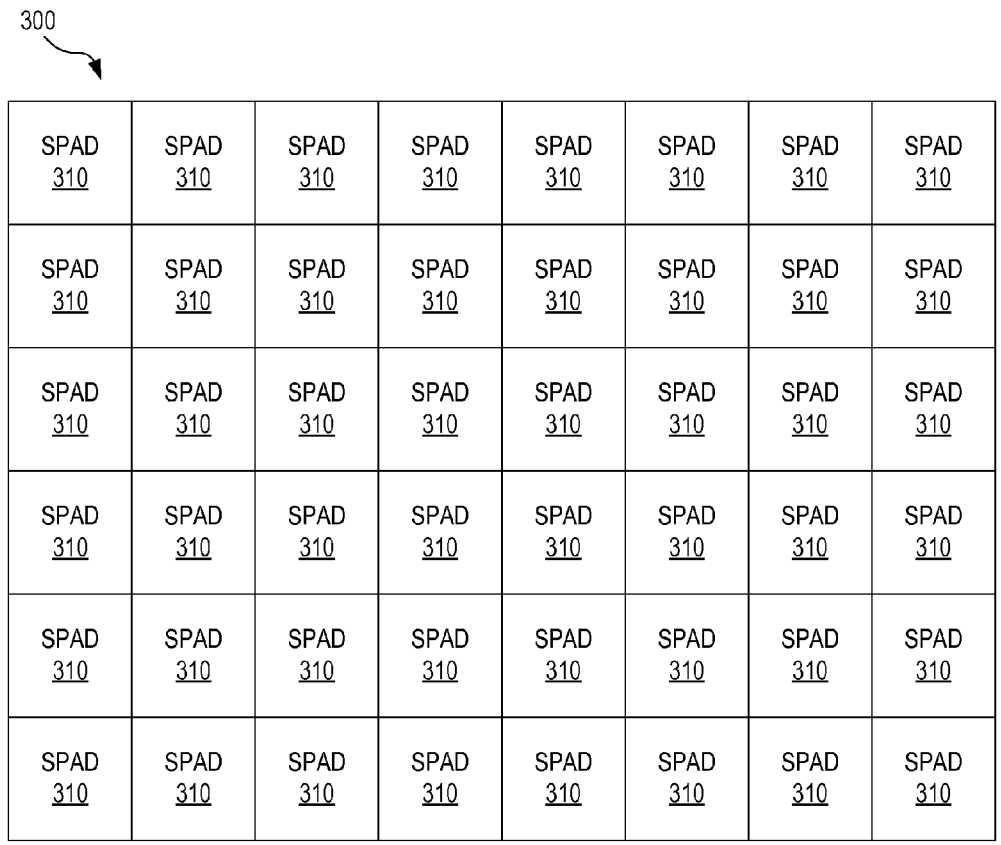
FIG. 3 illustrates a SPAD pixel array including an array of SPAD pixels, according to an embodiment.

FIG. 3 illustrates one exemplary SPAD pixel array 300 including an array of SPAD pixels 310. SPAD pixel array 300 is an embodiment of pixel array 120, and each SPAD pixel 310 is an embodiment of pixel 122. Each SPAD pixel 310 is sensitive to infrared light, for example. FIG. 3 shows SPAD pixel array 300 as viewed from scene 190, when SPAD pixel array 300 is implemented in image sensor 110 as pixel array 120. Without departing from the scope hereof, SPAD pixel array 300 may include more or fewer SPAD pixels 310 than shown in FIG. 3.

Figure 4A:
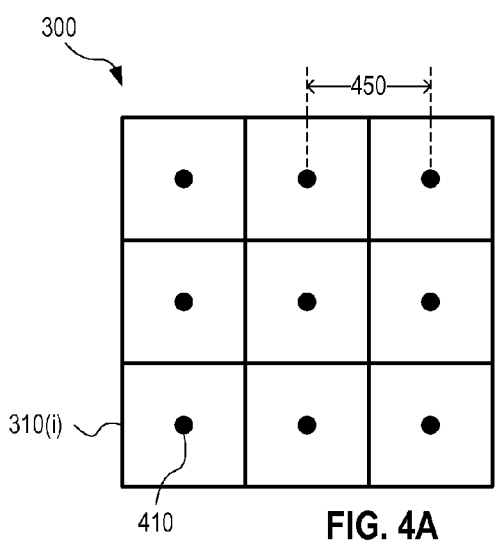
FIGS. 4A and 4B illustrate exemplary translation of the SPAD pixel array of FIG. 3 to generate a plurality of images from which an enhanced-resolution image may be generated.
Figure 4B:
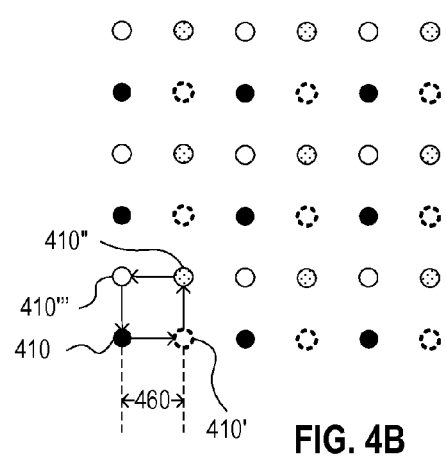

FIGS. 4A and 4B illustrate exemplary translation of SPAD pixel array 300 to generate a plurality of images 180, of scene 190, from which enhanced-resolution image 185 may be generated. FIGS. 4A and 4B show an embodiment of translation performed in step 212 of method 200. FIG. 4A shows a portion of SPAD pixel array 300 having 3×3 SPAD pixels 310. Each SPAD pixel 310 is indicated by its outline and a black dot at its center. For clarity of illustration, not all SPAD pixels 310 are labeled in FIG. 4A. SPAD pixels 310 are placed on a regular grid with grid spacing 450. Grid spacing 450 is in the range between one and twenty microns, for example. Although show in FIGS. 3 and 4A as being square, SPAD pixels 310 may have other shapes than square without departing from the scope hereof. For example, each SPAD pixel 310 may be a non-square rectangle. One SPAD pixel 310($i$) is centered at position 410. FIG. 4B shows exemplary spatially shifted locations of the 3×3 portion of SPAD pixel array 300, as obtained when actuator 130 translates image sensor 110 with pixel array 120 implemented as SPAD pixel array 300. FIGS. 4A and 4B are best viewed together.

In the exemplary translation shown in FIG. 4B, SPAD pixel array 300 is placed in four different positions. The initial position is characterized by SPAD pixel 310($i$) being in position 410. The second position is shifted to the right from the first position by a distance 460, and is indicated with dashed circles. The second position is characterized by SPAD pixel 310($i$) being in position 410'. The third position is shifted up from the second position by distance 460, and is indicated with shaded circles. The third position is characterized by SPAD pixel 310($i$) being in position 410". The fourth position is shifted to the left from the third position by distance 460, and is indicated with solid-outline circles. The fourth position is characterized by SPAD pixel 310($i$) being in position 410'''. In one example, distance 460 is less than grid spacing 450 such that the resolution of enhanced-resolution image 185 is greater than resolution of SPAD pixel array 300. In another example, distance 460 is half of grid spacing 450, such that images 180 captured at these four positions may be processed, for example by processing module 170, to compose enhanced-resolution image 185 having four evenly distributed image pixels for each image pixel of an individual image 180. In this example, the resolution of enhanced-resolution image 185 is doubled in each orthogonal dimension of enhanced-resolution image 185, as compared to an individual image 180.

Without departing from the scope hereof, actuator 130 may translate image sensor 110, implemented with SPAD pixel array 300, to achieve positions 410, 410', 410", and 410''' in a different order. Also without departing from the scope hereof, actuator 130 may place image sensor 110, implemented with SPAD pixel array 300, in more spatially shifted positions to enable generation of an enhanced-resolution image 185 of even higher resolution than that resulting from the example illustrated in FIG. 4B. For example, actuator 130 may place image sensor 110, implemented with SPAD pixel array 300, in nine different positions each separated from its nearest neighbor by a distance 460 that is a third of grid spacing 450. This example would enable generation of an enhanced-resolution image 185 having nine evenly distributed image pixels for each image pixel of an individual image 180. In this example, the resolution of enhanced-resolution image 185 would be tripled in each orthogonal dimension of enhanced-resolution image 185, as compared to an individual image 180.

Figure 5:
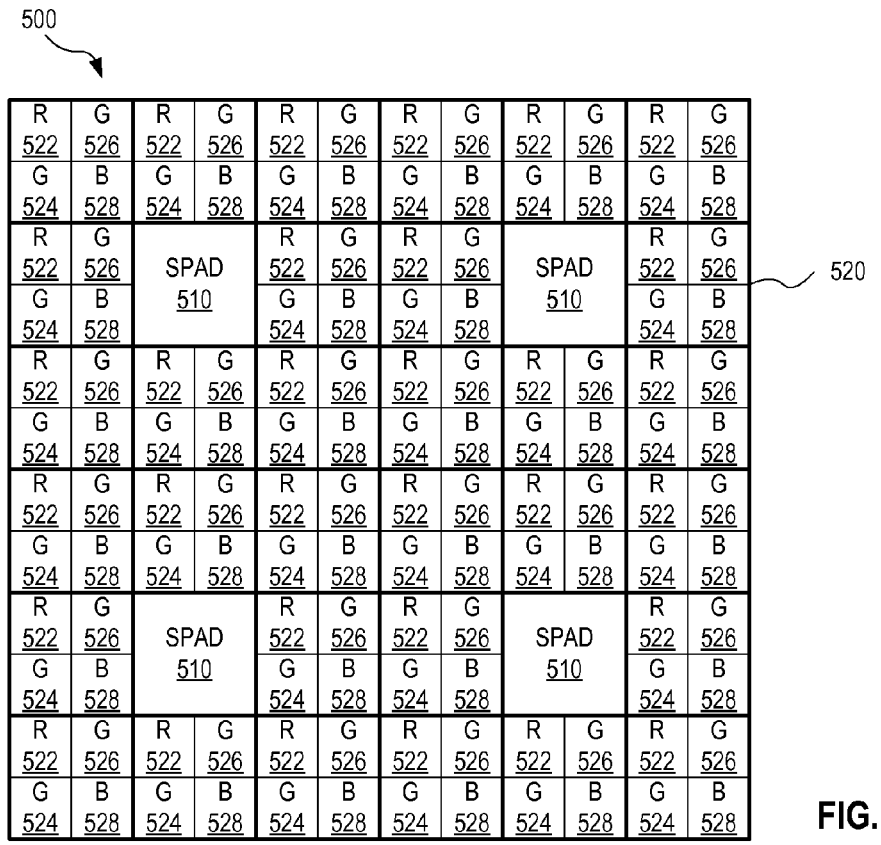
FIG. 5 illustrates a hybrid pixel array including a plurality of SPAD pixels and a plurality of color pixel groups, according to an embodiment.

FIG. 5 illustrates one exemplary hybrid pixel array 500 including a plurality of SPAD pixels 510 and a plurality of color pixel groups 520 arranged on a regular grid. SPAD pixels 510 are distributed evenly throughout hybrid pixel array 500, with one SPAD pixel 510 for every eight color pixel groups 520. Hybrid pixel array 500 is arranged with adjacent blocks of 3×3 units, each unit being occupied by one SPAD pixel 510 or one color pixel group 520, wherein each of the blocks includes exactly one SPAD pixel 510. Each SPAD pixel 510 is sensitive to infrared light, for example. Hybrid pixel array 500 is an embodiment of pixel array 120. FIG. 5 shows hybrid pixel array 500 as viewed from scene 190, when hybrid pixel array 500 is implemented in image sensor 110 as pixel array 120. Without departing from the scope hereof, hybrid pixel array 500 may be larger than shown in FIG. 5 and include more SPAD pixels 510 than shown in FIG. 5, while maintaining one SPAD pixel 510 for every eight color pixel groups 520.

Each color pixel group 520 includes a plurality of color pixels. In the example shown in FIG. 5, each color pixel group 520 includes (a) a red color pixel 522 predominantly sensitive to red light, (b) two green color pixels 524 and 526 predominantly sensitive to green light, and (c) a blue color pixel 528 predominantly sensitive to blue light. However, without departing from the scope hereof, color pixel groups 520 may be configured differently. For example, each color pixel group 520 may be configured according to an RGBE (red, green, blue, and emerald) pattern, a CYGM (cyan, yellow, green, and magenta) pattern, an RGBW (red, green, blue, and white) pattern, or another pattern known in the art. Color pixels 522, 524, 526, and 528 may be conventional pixels such as CMOS or CCD pixels.

When hybrid pixel array 500 is implemented in image sensor 110, image sensor 110 may capture a monochrome image using SPAD pixels 510 and capture a color image using color pixel groups 520. The monochrome image captured using SPAD pixels 510 has lower resolution than the full resolution of hybrid pixel array 500, wherein the full resolution refers to the resolution when taking into account both SPAD pixels 510 and color pixel groups 520. However, actuator 130 may translate image sensor 110, implemented with hybrid pixel array 500, to place hybrid pixel array 500 in a plurality of spatially shifted positions, and thereby enable generation of a monochrome image of higher resolution than the resolution of SPAD pixels 510 within hybrid pixel array 500.

Figure 6A:
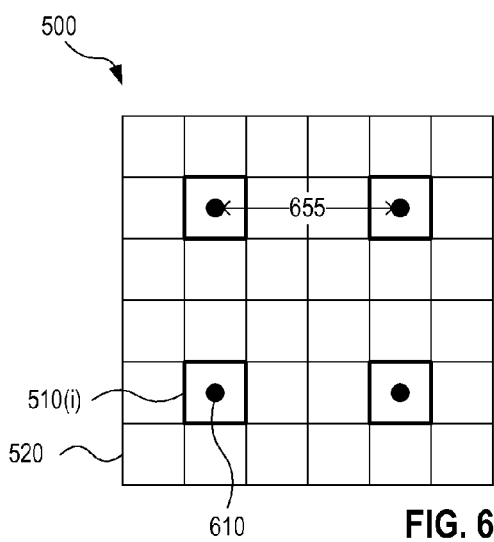
FIGS. 6A and 6B illustrate exemplary translation of the hybrid pixel array of FIG. 5 to generate a plurality of images, using SPAD pixels, from which an enhanced-resolution image may be generated.
Figure 6B:
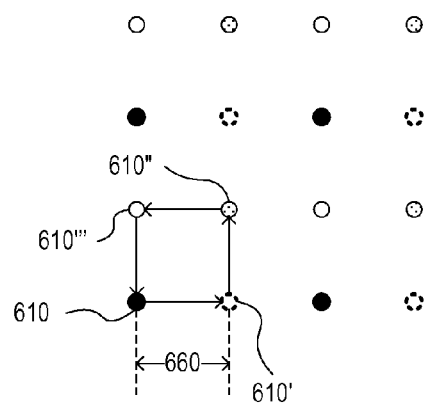

FIGS. 6A and 6B illustrate exemplary translation of hybrid pixel array 500 to generate a plurality of images 180, of scene 190 and using SPAD pixels 510, from which enhanced-resolution image 185 may be generated. FIGS. 6A and 6B show an embodiment of translation performed in step 212 of method 200. FIG. 6A shows a portion of hybrid pixel array 500 having 2×2 SPAD pixels 510. Each SPAD pixel 510 is indicated by its outline and a black dot at its center. For clarity of illustration, not all SPAD pixels 510 are labeled in FIG. 6A. Although shown in FIGS. 5 and 6A as being square, SPAD pixels 510 and color pixel groups 520 may have other shapes than square without departing from the scope hereof. For example, each SPAD pixel 510 and each color pixel group 520 may be a non-square rectangle. Each SPAD pixel 510 is a distance 655 away from its nearest neighboring SPAD pixel 510. Distance 655 is in the range between one and twenty microns, for example. One SPAD pixel 510($i$) is centered at position 610. FIG. 6B shows exemplary spatially shifted locations of the 2×2 SPAD pixels 510, as obtained when actuator 130 translates image sensor 110 with pixel array 120 implemented as hybrid pixel array 500. FIGS. 6A and 6B are best viewed together.

In the exemplary translation shown in FIG. 6B, hybrid pixel array 500 is placed in four different positions. The initial position is characterized by SPAD pixel 510($i$) being in position 610. The second position is shifted to the right from the first position by a distance 660, and is indicated with dashed circles. The second position is characterized by SPAD pixel 510($i$) being in position 610'. The third position is shifted up from the second position by distance 660, and is indicated with shaded circles. The third position is characterized by SPAD pixel 510($i$) being in position 610". The fourth position is shifted to the left from the third position by distance 660, and is indicated with solid-outline circles. The fourth position is characterized by SPAD pixel 510($i$) being in position 610'". In one example, distance 660 is half of distance 655. In this example, images 180 captured at these four positions, using SPAD pixels 510, may be processed, for example by processing module 170, to compose enhanced-resolution image 185 having four evenly distributed image pixels for each SPAD pixel 510 in hybrid pixel array 500. In this example, the resolution of enhanced-resolution image 185, generated based upon signals produced by SPAD pixels 510, is doubled in each orthogonal dimension of enhanced-resolution image 185, as compared to the resolution of SPAD pixels 510 in hybrid pixel array 500.

Without departing from the scope hereof, actuator 130 may translate image sensor 110, implemented with hybrid pixel array 500, to achieve positions 610, 610', 610", and 610'" in a different order. Also without departing from the scope hereof, actuator 130 may place image sensor 110, implemented with hybrid pixel array 500, in more spatially shifted positions to enable generation of an enhanced-resolution image 185 of even higher resolution than that resulting from the example illustrated in FIG. 6B. For example, actuator 130 may place image sensor 110, implemented with hybrid pixel array 500, in nine different positions each separated from its nearest neighbor by a distance 660 that is a third of distance 655. This example would enable composition of an enhanced-resolution image 185, based upon signals generated by SPAD pixels 510, having nine evenly distributed image pixels for each SPAD pixel 510 in hybrid pixel array 500. In this example, the resolution of enhanced-resolution image 185, based upon signals generated by SPAD pixels 510, would be tripled in each orthogonal dimension of enhanced-resolution image 185, as compared to the resolution of SPAD pixels 510 in hybrid pixel array 500. This results in the resolution of enhanced-resolution image 185 matching the full resolution of hybrid pixel array 500 when taking into account both SPAD pixels 510 and color pixel groups 520.

Figure 7:
FIG. 7 illustrates another hybrid pixel array including a plurality of SPAD pixels and a plurality of color pixel groups, according to an embodiment.

FIG. 7 illustrates one exemplary hybrid pixel array 700 including a plurality of SPAD pixels 510 and a plurality of color pixel groups 520 arranged on a regular grid. Hybrid pixel array 700 is similar to hybrid pixel array 500, except that hybrid pixel array 700 has one SPAD pixel 510 for every three color pixel groups 520. Hybrid pixel array 700 is arranged with adjacent blocks of 2×2 units, each unit being occupied by one SPAD pixel 510 or one color pixel group 520, wherein each of the blocks includes exactly one SPAD pixel 510. Hybrid pixel array 500 is an embodiment of pixel array 120. FIG. 7 shows hybrid pixel array 700 as viewed from scene 190, when hybrid pixel array 700 is implemented in image sensor 110 as pixel array 120. Without departing from the scope hereof, hybrid pixel array 700 may be larger than shown in FIG. 7 and include more SPAD pixels 510 than shown in FIG. 7, while maintaining one SPAD pixel 510 for every three color pixel groups 520.

When hybrid pixel array 700 is implemented in image sensor 110, image sensor 110 may capture a monochrome image using SPAD pixels 510 and capture a color image using color pixel groups 520. The monochrome image captured using SPAD pixels 510 has lower resolution than the full resolution of hybrid pixel array 700, wherein the full resolution refers to the resolution when taking into account both SPAD pixels 510 and color pixel groups 520. However, actuator 130 may translate image sensor 110, implemented with hybrid pixel array 700, to place hybrid pixel array 700 in a plurality of spatially shifted positions, and thereby enable generation of a monochrome image of higher resolution than the resolution of SPAD pixels 510 within hybrid pixel array 700.

Figure 8A:
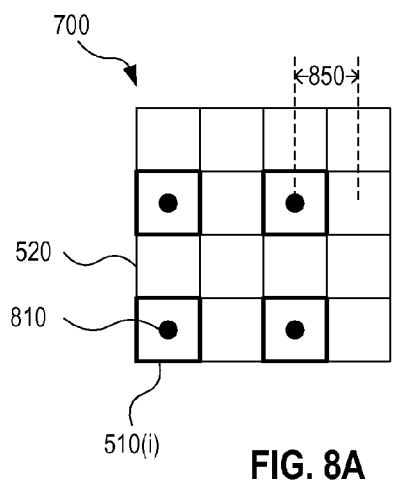
FIGS. 8A and 8B illustrate exemplary translation of the hybrid pixel array of FIG. 7 to generate a plurality of images, using SPAD pixels, from which an enhanced-resolution image may be generated.
Figure 8B:
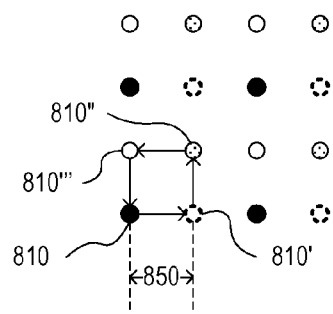

FIGS. 8A and 8B illustrate exemplary translation of hybrid pixel array 700 to generate a plurality of images 180, of scene 190 and using SPAD pixels 510, from which enhanced-resolution image 185 may be generated. FIGS. 8A and 8B show an embodiment of translation performed in step 212 of method 200. FIG. 8A shows a portion of hybrid pixel array 700 having 2×2 SPAD pixels 510. Each SPAD pixel 510 is indicated by its outline and a black dot at its center. For clarity of illustration, not all SPAD pixels 510 are labeled in FIG. 8A. SPAD pixels 510 and color pixel groups 520 are placed on a regular grid with grid spacing 850. Grid spacing 850 is in the range between one and twenty microns, for example. One SPAD pixel 510($i$) is centered at position 810. FIG. 8B shows exemplary spatially shifted locations of the 2×2 SPAD pixels 510, as obtained when actuator 130 translates image sensor 110 with pixel array 120 implemented as hybrid pixel array 700. FIGS. 8A and 8B are best viewed together.

In the exemplary translation shown in FIG. 8B, hybrid pixel array 700 is placed in four different positions. The initial position is characterized by SPAD pixel 510($i$) being in position 810. The second position is shifted to the right from the first position by grid spacing 850, and is indicated with dashed circles. The second position is characterized by SPAD pixel 510($i$) being in position 810'. The third position is shifted up from the second position by grid spacing 850, and is indicated with shaded circles. The third position is characterized by SPAD pixel 510($i$) being in position 810". The fourth position is shifted to the left from the third position by grid spacing 850, and is indicated with solid-outline circles. The fourth position is characterized by SPAD pixel 510($i$) being in position 810'". Images 180 captured at these four positions, using SPAD pixels 510, may be processed, for example by processing module 170, to compose enhanced-resolution image 185 having four evenly distributed image pixels for each SPAD pixel 510 in hybrid pixel array 700. In this example, the resolution of enhanced-resolution image 185, composed based upon signals generated by SPAD pixels 510, matches the full resolution of hybrid pixel array 700 when taking into account both SPAD pixels 510 and color pixel groups 520.

Without departing from the scope hereof, actuator 130 may translate image sensor 110, implemented with hybrid pixel array 700, to achieve positions 810, 810', 810", and 810'" in a different order. Also without departing from the scope hereof, actuator 130 may place image sensor 110, implemented with hybrid pixel array 700, in more spatially shifted positions to enable generation of an enhanced-resolution image 185 of even higher resolution than that resulting from the example illustrated in FIG. 8B.

Figure 8C:
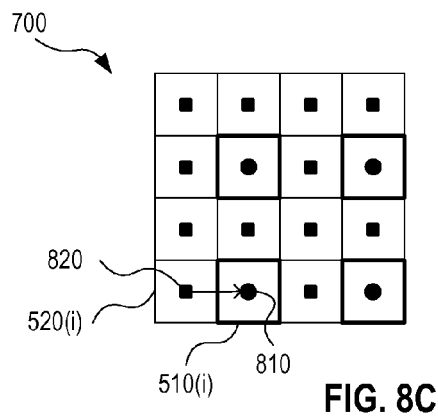
FIG. 8C illustrates exemplary spatial positions of color pixel groups associated with the translation of the hybrid pixel array of FIG. 7 illustrated in FIGS. 8A and 8B.

FIG. 8C illustrates exemplary spatial positions of color pixel groups 520 associated with the translation of hybrid pixel array 700 illustrated in FIGS. 8A and 8B. In FIG. 8C, the positions of color pixel groups are indicated with a black square. In an initial situation, corresponding to when SPAD pixel 510(*i*) of FIG. 8A is centered at position 810, one exemplary color pixel group 520(*i*) is centered at a position 820. When hybrid pixel array is translated to the right by grid spacing 850 (corresponding to translation of SPAD pixel 510(*i*) in FIG. 8A to from position 810 to position 810'), color pixel group 520(*i*) is translated from position 820 to position 810. Accordingly, the location previously occupied by SPAD pixel 510(*i*) is now occupied by color pixel group 520(*i*). It follows that the translation of hybrid pixel array 700 depicted in FIGS. 8A and 8B ensures that each pixel location, occupied by a SPAD pixel 510 in one of the spatially shifted positions shown in FIG. 8B, is occupied by a color pixel group 520 in at least one other one of these spatially shifted positions.

This same result may be achieved by translating hybrid pixel array 500 by a distance 660 to the right, wherein distance 660 is a third of distance 655. Thus, each of hybrid pixel arrays 500 and 700 are compatible with a translation scheme, wherein each pixel location, occupied by a SPAD pixel 510 in one of the spatially shifted positions, is occupied by a color pixel group 520 in at least one other one of these spatially shifted positions. From a set of images captured at least some of these spatially shifted positions and using color pixel groups 520, it is possible to compose a complete color image of scene 190, which is free of gaps associated with SPAD pixels 510.

Figure 9:
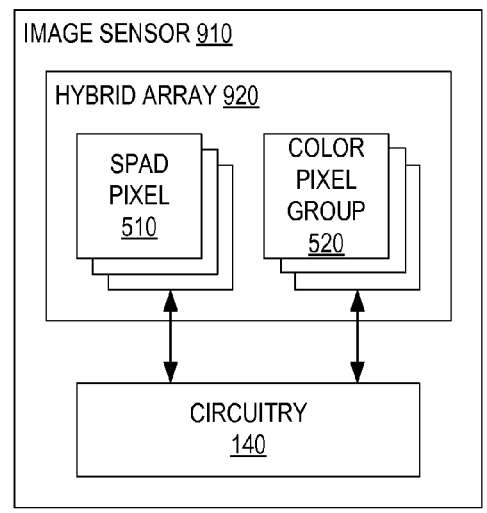
FIG. 9 illustrates a hybrid image sensor that includes a hybrid pixel array, according to an embodiment.

FIG. 9 illustrates one exemplary hybrid image sensor 910 that is an embodiment of image sensor 110. Hybrid image sensor 910 includes a hybrid pixel array 920 and circuitry 140. Hybrid pixel array 920 is an embodiment of pixel array 120 and includes a plurality of SPAD pixels 510 and a plurality of color pixel groups 520. SPAD pixels 510 are interspersed among color pixel groups 520. Although FIG. 9 shows hybrid pixel array 920 as including three SPAD pixels 510 and three color pixel groups 520, hybrid pixel array 920 may include a different number of SPAD pixels 510 and a different number of color pixel groups 520, without departing from the scope hereof. In one embodiment, hybrid pixel array 920 is hybrid pixel array 500. In another embodiment, hybrid pixel array 920 is hybrid pixel array 700.

Hybrid pixel array 920 is configured such that hybrid pixel array 920 may be translated by actuator 130, as discussed in reference to FIG. 1, to place hybrid pixel array 920 in (a) a plurality of first spatially shifted positions to capture a respective plurality of images 180 so as to enable composition of enhanced-resolution image 185 based upon signals generated by SPAD pixels 510, and (b) a plurality of spatially shifted second positions to capture a respective plurality of color images using color pixel groups 520 so as to enable composition of a complete color image free of gaps associated with SPAD pixels 510. The plurality of spatially shifted second positions are such that each pixel location, occupied by a SPAD pixel 510 in one of the spatially shifted second positions, is occupied by a color pixel group 520 in at least one other one of the spatially shifted second positions. The composition of the complete color image may be performed by processing module 170.

In one embodiment, the plurality of spatially shifted second positions is a subset of the plurality of first spatially shifted positions. In this embodiment, circuitry 140 may generate images 180 as composite images including signals from SPAD pixels 510 and signals from color pixel groups 520, such that processing module 170 may compose enhanced-resolution image 185 and the complete color image from these composite images. In another embodiment, the plurality of spatially shifted second positions is the same as the plurality of first spatially shifted positions. Also in this embodiment, circuitry 140 may generate images 180 as composite images including signals from SPAD pixels 510 and signals from color pixel groups 520, such that processing module 170 may compose enhanced-resolution image 185 and the complete color image from these composite images. In another embodiment, at least one of the spatially shifted second positions is different from each of the first spatially shifted positions. In this embodiment, circuitry 140 may generate separate image sets for composition of each of (a) enhanced-resolution image 185 based upon signals generated by SPAD pixels 510 and (b) the complete color image based upon signals generated by color pixel groups 520.

Figure 10:
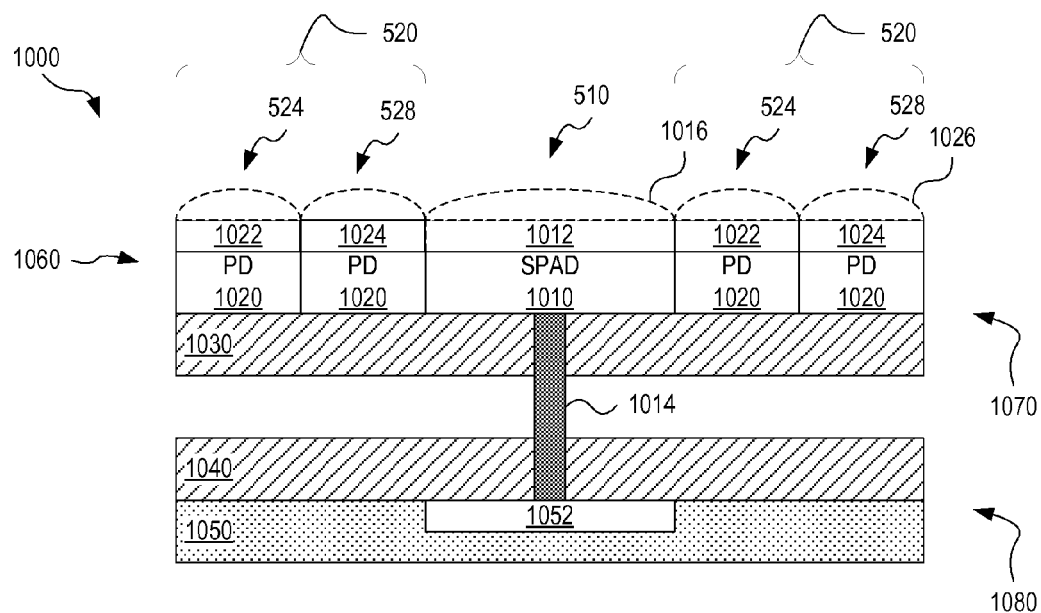
FIG. 10 illustrates a hybrid image sensor with a hybrid pixel array and separate readout of SPAD pixels and color pixel groups, according to an embodiment.

FIG. 10 illustrates one exemplary hybrid image sensor 1000 with a hybrid pixel array 1060 and separate readout of SPAD pixels 510 and color pixel groups 520. FIG. 10 shows hybrid image sensor 1000 in cross-sectional side view, wherein the cross section is taken in a plane orthogonal to the light receiving surface of hybrid image sensor 1000. Hybrid pixel array 1060 is an embodiment of hybrid pixel array 920, and hybrid image sensor 1000 is an embodiment of image sensor 110. Hybrid pixel array 1060 may be hybrid pixel array 500 or hybrid pixel array 700.

Hybrid pixel array 1060 includes a plurality of SPAD pixels 510 and a plurality of color pixel groups 520. For clarity of illustration, only a portion of hybrid image sensor 1000 associated with a portion of hybrid pixel array 1060 is shown in FIG. 10. This particular portion includes two color pixels 524 belonging to two different color pixel groups 520, two color pixels 528 belonging to two different color pixel groups 520, and one SPAD pixel 510. Color pixels 522 and 526 of these two color pixel groups 520 are located outside the cross section shown in FIG. 10. In the implementation shown in FIG. 10, each color pixel 524 includes a photodiode 1020, a color filter 1022, and optionally a microlens 1026; each color pixel 528 includes a photodiode 1020, a color filter 1024, and optionally a microlens 1026; and each SPAD pixel 510 includes a SPAD 1010 and, optionally, one or both of a color filter 1012 and a microlens 1016. Color filter 1012 is configured to transmit infrared light, for example.

Hybrid image sensor 1000 includes a first die 1070 and a second die 1080. First die 1070 includes hybrid pixel array 1060 and circuitry 1030. Circuitry 1030 is connected to color pixels 522, 524, 526 and 528 of each color pixel group 520, and performs readout of signals from color pixel groups 520 to output color images based upon signals generated by color pixel groups 520. Second die 1080 includes a substrate 1050, a SPAD readout circuit 1052 for each of SPADs 1010, and a connection layer 1040. For each SPAD 1010, hybrid image sensor 1000 further includes a bond 1014 that connects SPAD 1010 to a respective SPAD readout circuit 1052. SPAD readout circuits 1052 read out signals from SPADs 1010, respectively, and connection layer 1040 process the readout signals from SPAD readout circuits 1052 to output images 180. Circuitry 1030, connection layer 1040, and SPAD readout circuits 1052 cooperate to form an embodiment of circuitry 140.

Separate readout of SPAD pixels 510 and color pixel groups 520 enables hybrid image sensor 1000 to perform readout of SPAD pixels 510 at a higher frame rate than that of color pixel groups 520. Thereby, the separate readout of SPAD pixels 510 and color pixel groups 520 enables to utilize the high-frame-rate capability of SPADS 1010 without being limited by a slower frame rate associated with readout of color pixel groups 520.

Figure 11:
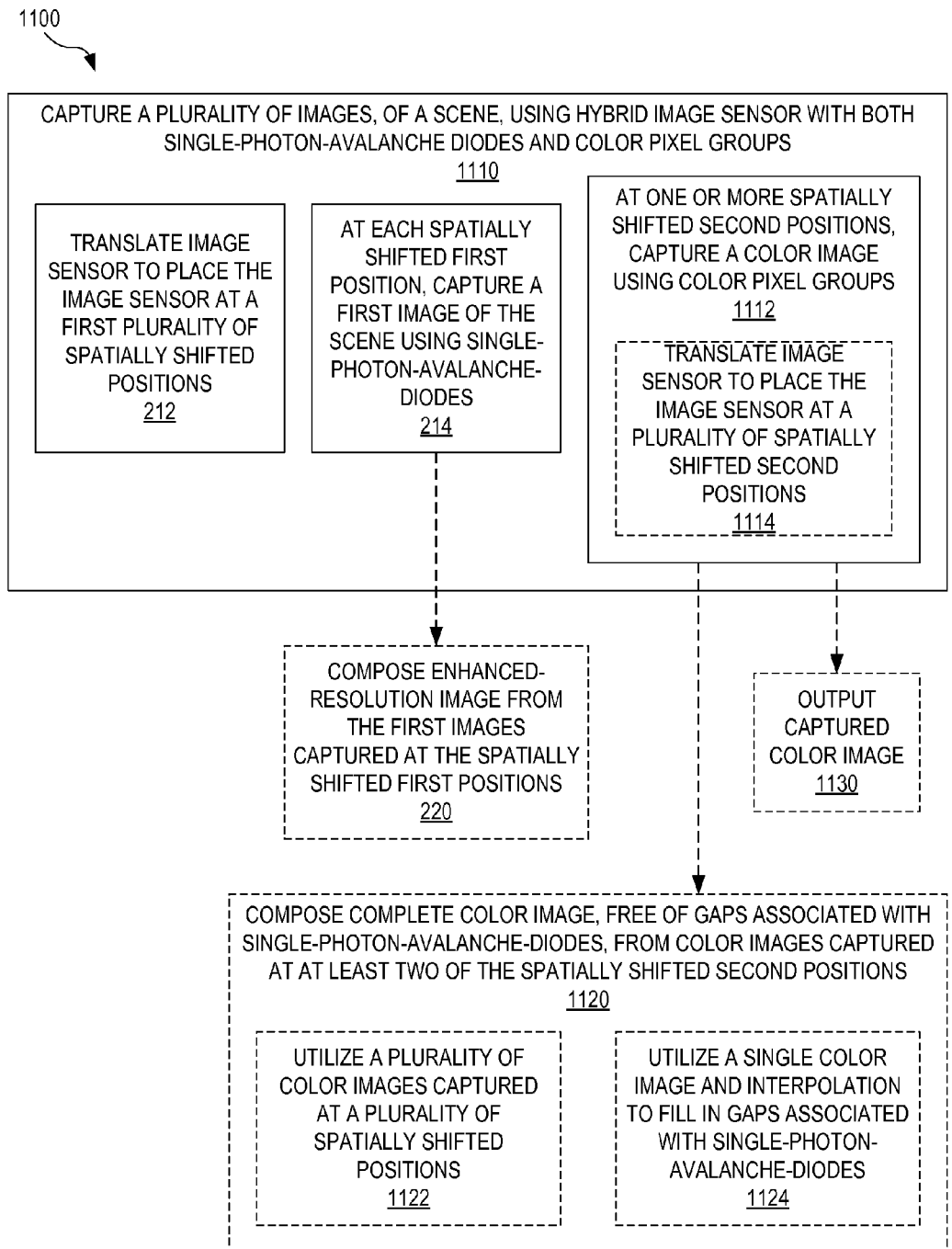
FIG. 11 illustrates a method for capturing images that enable composition of both an enhanced-resolution image and a complete color image, according to an embodiment.

FIG. 11 illustrates one exemplary method 1100 for capturing images that enable composition of both an enhanced-resolution image and a complete color image of a scene. Method 1100 is an extension of method 200. Method 1100 may be performed by imaging system 100 implemented with hybrid pixel array 920.

In a step 1110, method 1100 captures a plurality of images, of a scene, using a hybrid image sensor with both SPAD pixels and color pixel groups. Step 1110 includes steps 212 and 214, wherein step 214 is performed using the SPAD pixels of the hybrid image sensor. In one example of steps 212 and 214, as implemented in method 1100, actuator 130 translates image sensor 110, implemented with hybrid pixel array 920, to place hybrid pixel array 920 in a plurality of spatially shifted first positions. At each of these spatially shifted first positions, image sensor 110 uses SPAD pixels 510 of hybrid pixel array 920 to capture an image 180 of scene 190. In this example, hybrid pixel array 920 may be hybrid pixel array 500 and step 212 may include translation as shown in FIGS. 6A and 6B, or hybrid pixel array 920 may be hybrid pixel array 700 and step 212 may include translation as shown in FIGS. 8A and 8B.

Step 1110 further includes a step 1112 of using the color image groups of the hybrid image sensor to capture at least one color image. Step 1110 may be performed using hybrid pixel array 500 or hybrid pixel array 700.

In one embodiment, step 1112 captures a single color image with the image sensor at a single second position. This second position may be one of the plurality of spatially shifted first positions of step 212, or the second position may be different from each of the plurality of spatially shifted first positions of step 212. In one example of this embodiment of step 1112, image sensor 110, implemented with hybrid pixel array 920, uses color pixel groups 520 to capture a color image of scene 190.

In another embodiment, step 1112 includes a step 1114 of translating the hybrid image sensor in one or more directions parallel to the light-receiving surface of the hybrid image sensor to place the hybrid image sensor at the plurality of spatially shifted second positions, such that step 1112 captures a plurality of color images at the plurality of spatially shifted second positions, respectively. The single second position may be one of the plurality of spatially shifted first positions of step 212. The plurality of spatially shifted second positions may relate to the plurality of spatially shifted first positions as discussed above in reference to FIG. 9. In one example of this embodiment, actuator 130 translates image sensor 110, implemented with hybrid pixel array 920, to place hybrid pixel array 920 in the plurality of spatially shifted second positions. At each of these spatially shifted second positions, image sensor 110 uses color pixel groups 520 of hybrid pixel array 920 to capture a color image of scene 190. In this example, hybrid pixel array 920 may be hybrid pixel array 500. Also in this example, step 1114 may include translation that ensures that each pixel location, occupied by a SPAD pixel 510 in one of the plurality of spatially shifted second positions, is occupied by a color pixel group 520 in at least one other one of the plurality of spatially shifted second positions, for example as shown in FIG. 9.

In an embodiment, step 1110 utilizes an image sensor with separate readout of SPAD pixels and color pixel groups, such that method 1100 may perform image capture in step 214 at a higher frame rate than image capture in step 1112. In one example of this embodiment, step 1110 utilizes hybrid image sensor 1000.

In certain embodiments, method 1100 includes step 220 to compose enhanced-resolution image 185 based upon signals generated by the SPAD pixels at the plurality of spatially shifted first positions. In one example of step 220, processing module 170 composes enhanced-resolution image 185.

Optionally, method 1100 includes a step 1120 of composing a complete color image of the scene from at least one color image captured in step 1112. This complete color image is free of gaps associated with SPAD pixels 510. Step 1120 is performed by processing module 170, for example. In one embodiment, step 1120 includes a step 1122 of utilizing a plurality of color images captured in step 1112 at a plurality of spatially shifted second positions, respectively, to compose the complete color image. In this embodiment, the spatially shifted second positions are such that each pixel location, occupied by a SPAD pixel in one of the plurality of spatially shifted second positions, is occupied by a color pixel group in at least one other one of the plurality of spatially shifted second positions. In another embodiment, step 1120 includes a step 1124 of composing the complete color image based upon only a single color image captured in step 1112. Step 1124 utilizes interpolation between color image pixels corresponding to color pixel groups to determine values of color image pixels corresponding to SPAD pixels.

In an embodiment, method 1100 includes a step 1130 of outputting a color image captured in step 1112. In one example of step 1130, image sensor 110, implemented with hybrid pixel array 920, outputs a color image captured using color pixel groups 520.

Although not shown in FIG. 11, method 1100 may be performed repeatedly to generate or enable generation of a stream of enhanced-resolution images, complete color images, and/or captured color images, without departing from the scope hereof.

Figure 12:
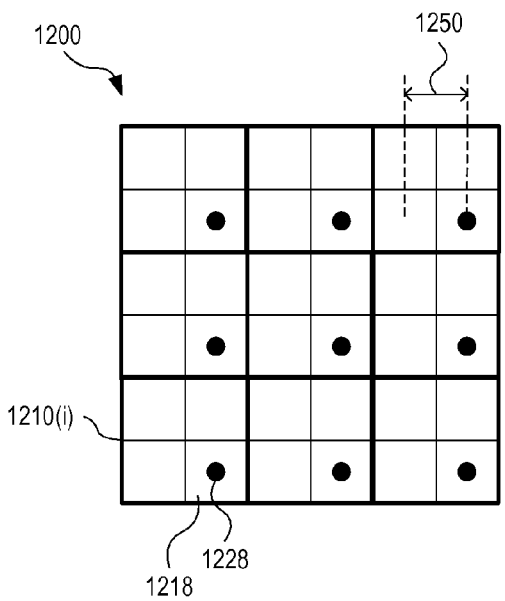
FIG. 12 illustrates a color-sensitive SPAD pixel array, according to an embodiment.

FIG. 12 illustrates one exemplary color-sensitive SPAD pixel array 1200 that is an embodiment of pixel array 120. Color-sensitive SPAD pixel array 1200 includes a plurality of SPAD color pixel groups 1210. Each SPAD color pixel group 1210 includes a plurality of color-specific SPAD pixels 1212, 1214, 1216, and 1218, sensitive to a respective plurality of colors. In the example shown in FIG. 12, color-specific SPAD pixels 1212, 1214, 1216, and 1218 are predominantly sensitive to red, green, blue, and infrared light, respectively. However, color-specific SPAD pixels 1212, 1214, 1216, and 1218 may have other color sensitivities without departing from the scope hereof. Likewise, color-sensitive SPAD pixel array 1200 may include fewer or more SPAD color pixel groups 1210 than shown in FIG. 12.

Figures 13A, 13B:
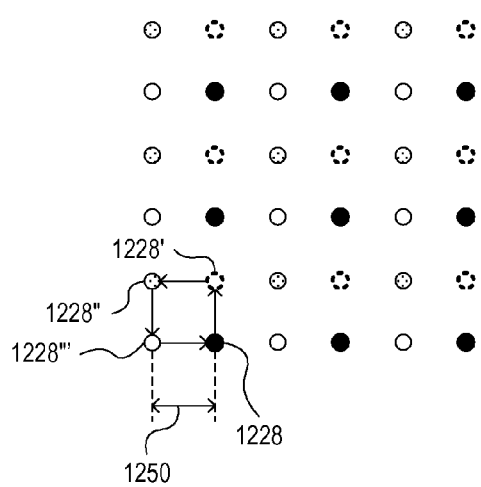
FIGS. 13A and 13B illustrate exemplary translation of the color-sensitive SPAD pixel array of FIG. 12 to generate a plurality of color images, using SPAD color pixel groups, from which an enhanced-resolution image may be generated.

FIGS. 13A and 13B illustrate exemplary translation of color-sensitive SPAD pixel array 1200 to generate a plurality of color images 180, of scene 190 and using SPAD color pixel groups 1210, from which enhanced-resolution image 185 may be generated. FIGS. 13A and 13B show an embodiment of translation performed in step 212 of method 200. FIG. 13A shows a portion of color-sensitive SPAD pixel array 1200 having 3×3 SPAD color pixel groups 1210. Each SPAD color pixel group 1210 is indicated by its outline and a black dot at the center of color-specific SPAD pixel 1218. For clarity of illustration, not all SPAD color pixel groups 1210 and not all color-specific SPAD pixels 1212, 1214, 1216, and 1218 are labeled in FIG. 13A. Although shown in FIGS. 12 and 13A as being square, SPAD color pixel groups 1210 and color-specific SPAD pixels 1212, 1214, 1216, and 1218 may have other shapes than square without departing from the scope hereof. For example, each SPAD color pixel groups 1210 and each color-specific SPAD pixels 1212, 1214, 1216, and 1218 may be a non-square rectangle. Each color-specific SPAD pixel is a distance 1250 away from its nearest neighboring color-specific SPAD pixel. Distance 1250 is in the range between one and twenty microns, for example. One SPAD color pixel group 1210(i) is positioned such that the associated color-specific SPAD pixel 1218 is centered at position 1228. FIG. 13B shows exemplary spatially shifted locations of the 3×3 SPAD color pixel groups 1210, as obtained when actuator 130 translates image sensor 110 with pixel array 120 implemented as color-sensitive SPAD pixel array 1200. FIGS. 13A and 13B are best viewed together.

In the exemplary translation shown in FIG. 13B, color-sensitive SPAD pixel array 1200 is placed in four different positions. The initial position is characterized by one color-specific SPAD pixel 1218(i) being in position 1228. The second position is shifted up from the first position by distance 1250, and is indicated with dashed circles. The second position is characterized by color-specific SPAD pixel 1218(i) being in position 1228'. The third position is shifted to the left from the second position by distance 1250, and is indicated with shaded circles. The third position is characterized by color-specific SPAD pixel 1218(i) being in position 1228". The fourth position is shifted down from the third position by distance 1250, and is indicated with solid-outline circles. The fourth position is characterized by color-specific SPAD pixel 1218(i) being in position 1228'''.

Color images 180 captured at these four positions, using SPAD color pixel groups 1210, may be processed, for example by processing module 170, to compose enhanced-resolution image 185 having four evenly distributed color image pixels for each SPAD color pixel group 1210 in color-sensitive SPAD pixel array 1200. Thus, the resolution of enhanced-resolution image 185, generated based upon signals produced by SPAD color pixel groups 1210, is doubled in each orthogonal dimension of enhanced-resolution image 185, as compared to the resolution of SPAD color pixel groups 1210 in color-sensitive SPAD pixel array 1200. Alternatively, color images 180 captured at these four positions, using SPAD color pixel groups 1210, may be processed, for example by processing module 170 to compose (a) an infrared image based upon signals generated by color-specific SPAD pixels 1218 of double resolution as compared to the resolution of color-specific SPAD pixels 1218 in color-sensitive SPAD pixel array 1200, and (b) a visual color image based upon signals generated by color-specific SPAD pixels 1212, 1214, and 1216. This visual color image may be a single visual color image captured using color-specific SPAD pixels 1212, 1214, and 1216, or an enhanced-resolution visual color image composed from of images captured using color-specific SPAD pixels 1212, 1214, and 1216 at the four spatially shifted positions shown in FIG. 13B.

Without departing from the scope hereof, actuator 130 may translate image sensor 110, implemented with color-sensitive SPAD pixel array 1200, to achieve positions 1228, 1228', 1228", and 1228''' in a different order. Also without departing from the scope hereof, actuator 130 may place image sensor 110, implemented with color-sensitive SPAD pixel array 1200, in more spatially shifted positions to enable generation of an enhanced-resolution image 185 of even higher resolution than that resulting from the example illustrated in FIG. 13B.

Figure 14:
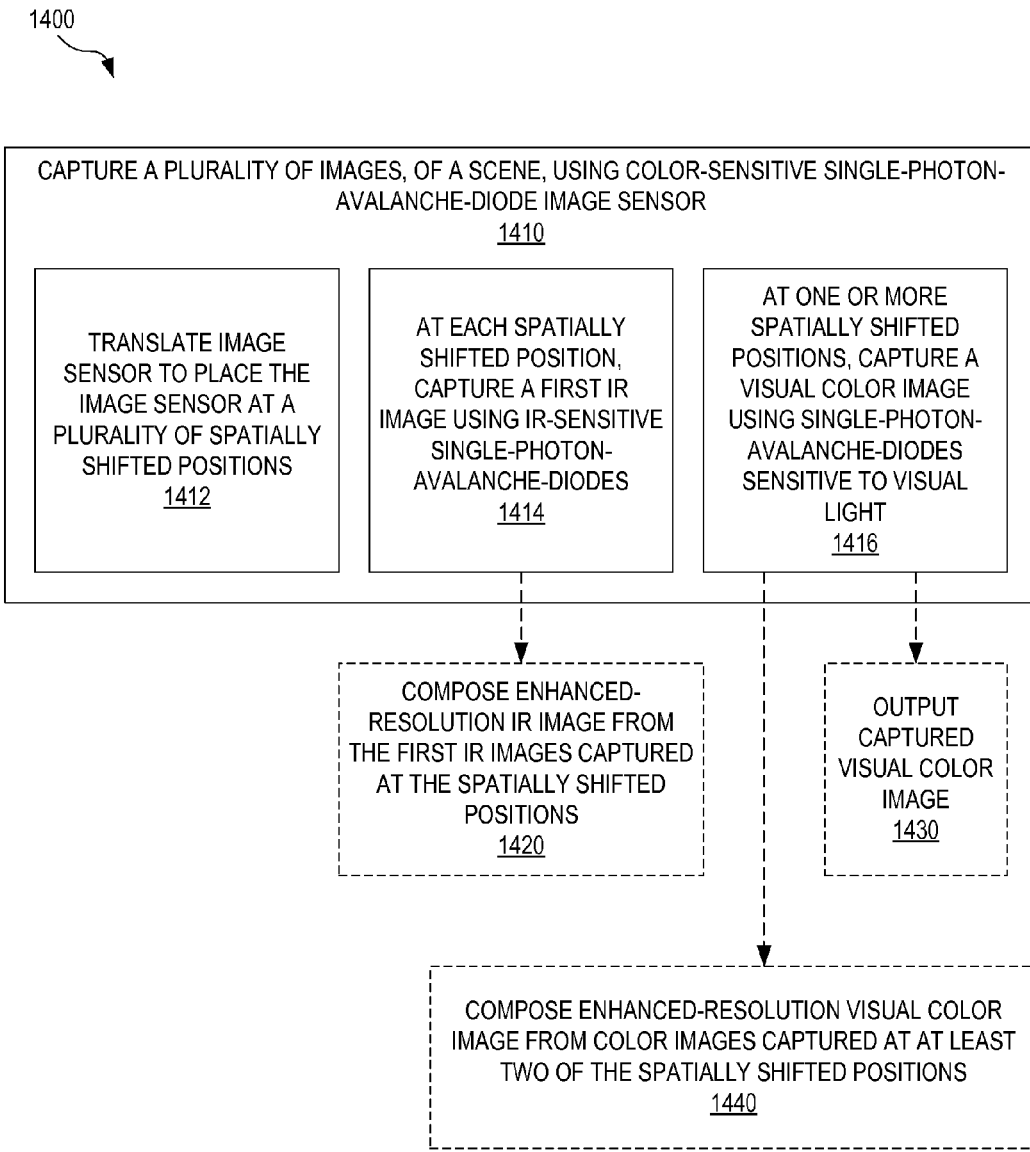
FIG. 14 illustrates a method for capturing images that enable composition of both an enhanced-resolution infrared image and a visual color image, according to an embodiment.

FIG. 14 illustrates one exemplary method 1400 for capturing images that enable composition of both an enhanced-resolution infrared image and a visual color image of a scene. Method 1100 is an embodiment of method 200, which utilizes a color-sensitive SPAD pixel array. Method 1100 may be performed by imaging system 100 implemented with color-sensitive SPAD pixel array 1200.

In a step 1410, method 1400 captures a plurality of images, of a scene, using a color image sensor having a color-sensitive SPAD pixel array. The color-sensitive SPAD pixel array includes a plurality of SPAD color pixel groups. Each SPAD color pixel group has (a) at least one SPAD pixel sensitive to infrared light and (b) a plurality of SPAD pixels sensitive to a plurality of different colors of visual light. Step 1410 includes steps 1412, 1414, and 1416.

In step 1412, the color image sensor is translated to place the color image sensor at a plurality of spatially shifted positions. Step 1412 is an embodiment of step 212. Step 1412 shifts the image sensor such that each pixel location that, in one of the spatially shifted positions, is occupied by a SPAD pixel sensitive to visual light is, in at least one other one of the spatially shifted positions, occupied by a SPAD pixel sensitive to infrared light. In one example of step 1412, actuator 130 translates image sensor 110, implemented with color-sensitive SPAD pixel array 1200, to place color-sensitive SPAD pixel array 1200 at the plurality of spatially shifted positions illustrated in FIG. 13B.

Step 1414 uses the SPAD pixels sensitive to infrared light to capture a first infrared (IR) image of a scene for each of the spatially shifted positions achieved in step 1412. In one example of step 1414, image sensor 110, implemented with color-sensitive SPAD pixel array 1200, uses color-specific SPAD pixels 1218 to capture a first infrared image of scene 190 at each of the spatially shifted positions illustrated in FIG. 13B.

Step 1416 uses the SPAD pixels sensitive to visual light to capture a visual color image of the scene for one or more of the spatially shifted positions achieved in step 1412. In one example of step 1416, image sensor 110, implemented with color-sensitive SPAD pixel array 1200, uses color-specific SPAD pixels 1212, 1214, and 1216 to capture a visual color image of scene 190 at one or more of the spatially shifted positions illustrated in FIG. 13B.

In one embodiment, method 1400 performs steps 1414 and 1416 simultaneously such that step 1410 captures a color image at each of the spatially shifted positions achieved in step 1412, wherein each color image is captured using both the SPAD pixels sensitive to infrared light and the SPAD pixels sensitive to visual light. In this embodiment, step 1410 includes processing these color images to produce separate infrared images and visual color images formed from signals generated by the SPAD pixels sensitive to infrared and the SPAD pixels sensitive to visual light, respectively.

In certain embodiments, method 1100 includes a step 1420 to compose an enhanced-resolution infrared image 185 based upon signals generated by the first infrared images captured in step 1414. In one example of step 1420, processing module 170 composes enhanced-resolution infrared image 185.

In one embodiment, method 1400 includes a step 1430 of outputting a visual color image captured in step 1416. In one example of step 1430, image sensor 110, implemented with color-sensitive SPAD pixel array 1200 outputs a visual color image captured in step 1416.

In another embodiment, method 1400 includes a step 1440 of composing an enhanced-resolution visual color image 185 based upon at least two visual color images captured in step 1416 at least two spatially shifted positions, respectively. In one example of step 1440, processing module 170 composes enhanced-resolution visual color image 185.

Although not shown in FIG. 14, method 1400 may be performed repeatedly to generate or enable generation of a stream of enhanced-resolution infrared images, enhanced-resolution visual color images, and/or captured visual color images, without departing from the scope hereof.

Figure 15:
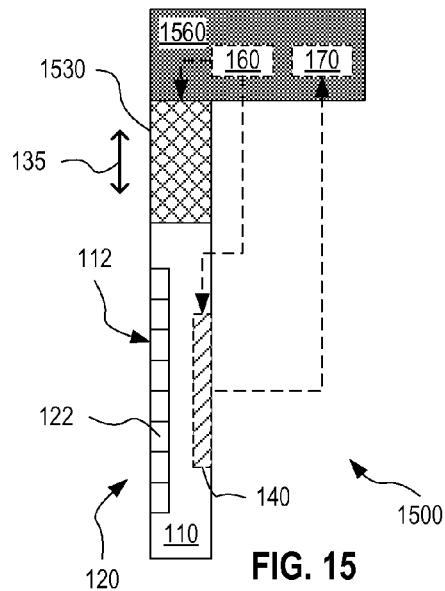
FIG. 15 illustrates an imaging system with sensor translation functionality, according to an embodiment.

FIG. 15 illustrates one exemplary imaging system 1500 with sensor translation functionality. Imaging system 1500 includes image sensor 110, an actuator 1530, and a fixture 1560. Actuator 1530 is an embodiment of actuator 130, imaging system 1500 is an embodiment of imaging system 100. Imaging system 1500 may implement one or more of methods 200, 1100, and 1400.

Actuator 1530 is affixed to fixture 1560 and image sensor 110. Actuator 1530 translates image sensor 110 relative to fixture 1560 along direction 135. Without departing from the scope hereof, imaging system 1500 may include a second actuator 1530 (not shown), also affixed to fixture 1560 and image sensor 110, wherein this second actuator 1530 translates image sensor 110 along a direction parallel to light-receiving surface 112 but not parallel to direction 135.

In one embodiment, actuator 1530 includes a piezoelectric element, having a voltage-controlled thickness, to change the distance between image sensor 110 and fixture 1560. In another embodiment, actuator 1530 includes a microelectromechanical system (MEMS) to translate image sensor 110 relative to fixture 1560. This MEMS is, for example, an electrothermal actuator sharing certain properties with electrothermal actuators disclosed by Mallick et al. (Mallick et al., "Design and Simulation of MEMS Based Electrothermal Micromirror for 3D Spatial Movement", Proceedings of the 2011 COMSOL Conference in Bangalore). In yet another embodiment, actuator 1530 includes a cam to translate image sensor 110 relative to fixture 1560.

In certain embodiments, control module 160 and/or processing module 170 are integrated with fixture 1560. Fixture 1560 may be a circuit board, such that imaging system 1500 has on-chip translation functionality. Without departing from the scope hereof, at least a portion of control module 160 and/or processing module 170 may be implemented in image sensor 110, for example as part of circuitry 140.

Figure 16:
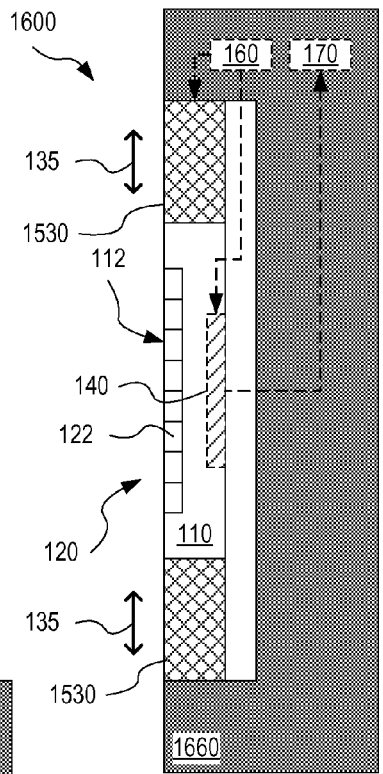
FIG. 16 illustrates another imaging system with sensor translation functionality, according to an embodiment.

FIG. 16 illustrates another exemplary imaging system 1600 with sensor translation functionality. Imaging system 1600 includes image sensor 110, two actuators 1530, and a fixture 1660. Imaging system 1600 is an embodiment of imaging system 100. Imaging system 1700 may implement one or more of methods 200, 1100, and 1400.

Each actuator 1530 is affixed to fixture 1660 and image sensor 110. Actuators 1530 translate image sensor 110 relative to fixture 1660 along direction 135. Actuators 1530 are mounted on opposite sides of image sensor 110 such that, when one actuator 1530 increases the distance between image sensor 110 and fixture 1660, the other actuator 1530 deceases the distance between image sensor 110 and fixture 1660. Without departing from the scope hereof, imaging system 1600 may include a second similarly configured pair of actuators 1530 (not shown), also affixed to fixture 1660 and image sensor 110, wherein this second pair of actuators 1530 translates image sensor 110 along a direction parallel to light-receiving surface 112 but not parallel to direction 135.

In certain embodiments, control module 160 and/or processing module 170 are integrated with fixture 1660. Fixture 1660 may be a circuit board, such that imaging system 1600 has on-chip translation functionality. Without departing from the scope hereof, at least a portion of control module 160 and/or processing module 170 may be implemented in image sensor 110, for example as part of circuitry 140.

Figure 17:
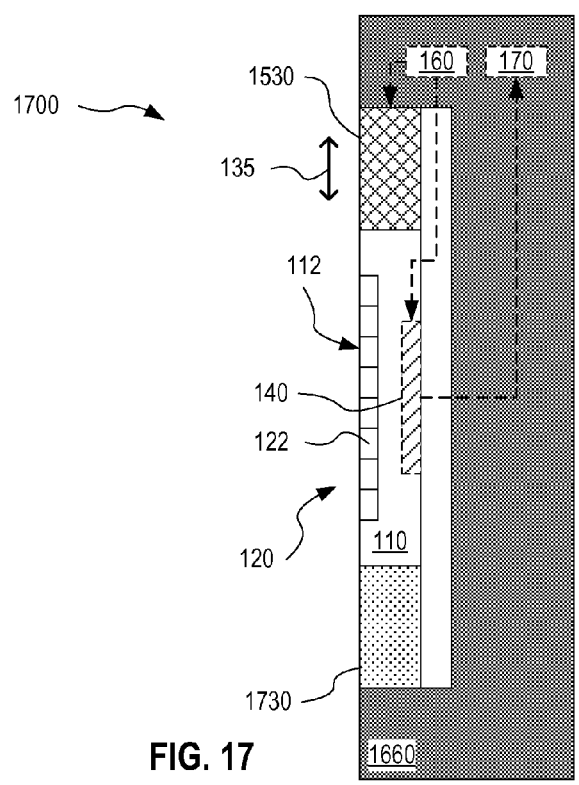
FIG. 17 illustrates yet another imaging system with sensor translation functionality, according to an embodiment.

FIG. 17 illustrates yet another exemplary imaging system 1700 with sensor translation functionality. Imaging system 1700 includes image sensor 110, actuator 1530, a support element 1730, and fixture 1660. Imaging system 1700 is an embodiment of imaging system 100. Imaging system 1700 may implement one or more of methods 200, 1100, and 1400.

Actuator 1530 is affixed to fixture 1660 and contacts image sensor 110. Actuator 1530 translates image sensor 110 relative to fixture 1660 along direction 135. Support element 1730 is affixed to fixture 1660 and image sensor 110 on a side of image sensor 110 opposite to that associated with actuator 1530. Support element 1730 includes a spring or a material with a spring constant. When actuator 1530 decreases or increases the distance between image sensor 110 and fixture 1660, on the side of image sensor 110 associated with actuator 1530, support element 1730 extends or contracts accordingly.

Without departing from the scope hereof, imaging system 1700 may include a second similarly configured set of an actuator 1530 and a support element 1730 (not shown), also affixed to fixture 1660 and image sensor 110, wherein this second set of actuator 1530 and support element 1730 translates image sensor 110 along a direction parallel to light-receiving surface 112 but not parallel to direction 135.

In certain embodiments, control module 160 and/or processing module 170 are integrated with fixture 1660. Fixture 1660 may be a circuit board, such that imaging system 1700 has on-chip translation functionality. Without departing from the scope hereof, at least a portion of control module 160 and/or processing module 170 may be implemented in image sensor 110, for example as part of circuitry 140.

Figure 18:
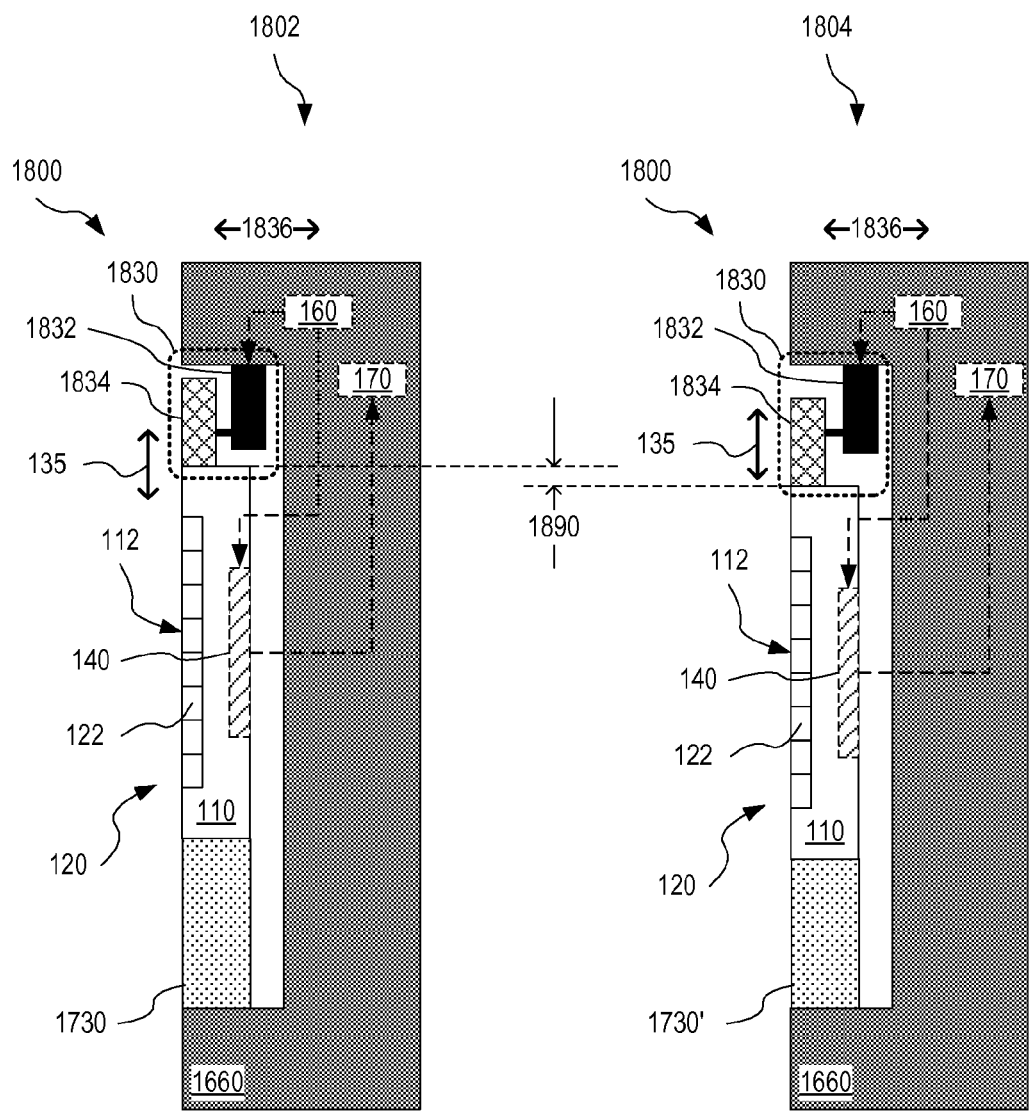
FIG. 18 illustrates an imaging system with cam-actuated sensor translation, according to an embodiment.

FIG. 18 illustrates one exemplary imaging system 1800 with cam-actuated sensor translation. Imaging system 1800 includes image sensor 110, a cam actuator 1830, support element 1730, and fixture 1660. Imaging system 1800 is an embodiment of imaging system 1700. Imaging system 1800 may implement one or more of methods 200, 1100, and 1400.

Cam actuator 1830 includes a motor 1832 and a cam 1834 mounted on a shaft of motor 1832. Motor 1832 is affixed to fixture 1660, and cam 1834 presses against image sensor 110. Motor 1832 may be actuated to rotate cam 1834 so as to change the distance between image sensor 110 and fixture 1660 on the side of image sensor 110 associated with cam actuator 1830. This is illustrated by two states 1802 and 1804 of imaging system 1800. States 1802 and 1804 correspond to two different rotation states of cam 1834. In state 1804, image sensor 110 is shifted by a distance 1890 relative to the position of image sensor 110 in state 1802. When cam actuator 1830 decreases or increases the distance between image sensor 110 and fixture 1660, support element 1730 extends or contracts accordingly.

Without departing from the scope hereof, imaging system 1800 may include a second similarly configured set of a cam actuator 1830 and a support element 1730, also affixed to fixture 1660 and image sensor 110, wherein this second set of cam actuator 1830 and support element 1730 translates image sensor 110 along a direction parallel to light-receiving surface 112 but not parallel to direction 135.

Combinations of Features

Features described above as well as those claimed below may be combined in various ways without departing from the scope hereof. For example, it will be appreciated that aspects of one imaging system with SPADs and sensor translation, or associated method, described herein may incorporate or swap features of another imaging system with SPADs and sensor translation, or associated method, described herein. The following examples illustrate some possible, non-limiting combinations of embodiments described above. It should be clear that many other changes and modifications may be made to the systems and methods herein without departing from the spirit and scope of this invention:

(A1) An imaging system with single-photon-avalanche-diodes and sensor translation for capturing a plurality of first images to enable generation of an enhanced-resolution image of a scene may include (a) an image sensor with a pixel array including single-photon-avalanche-diode pixels for capturing the plurality of first images of the scene at a plurality of spatially shifted positions of the image sensor, respectively, and (b) an actuator for translating the image sensor, parallel to light receiving surface of the image sensor, to place the image sensor at the plurality of spatially shifted positions.

(A2) The imaging system denoted as (A1) may further include a processing module for processing the plurality of first images to compose the enhanced-resolution image.

(A3) In either of the imaging systems denoted as (A1) and (A2), the single-photon-avalanche-diode pixels may form all pixels of the pixel array.

(A4) In any of the imaging systems denoted as (A1) through (A3), the spatially shifted positions may include positions that are shifted from each other by less than center-to-center spacing between nearest-neighbor pairs of the single-photon-avalanche-diode pixels, such that resolution of the enhanced-resolution image exceeds resolution of the pixel array.

(A5) In any of the imaging systems denoted as (A1) through (A5), the pixel array may further include color pixel groups for capturing a color image of the scene, each of the color pixel groups having a plurality of color-specific pixels sensitive to a respective plurality of different colors, the single-photon-avalanche-diode pixels being interspersed among the color pixel groups.

(A6) In the imaging system denoted as (A5), each of the color pixel groups may have same extent as each of the single-photon-avalanche-diode pixels.

(A7) In either of the imaging systems denoted as (A5) and (A6), the pixel array may be arranged with adjacent 3×3 blocks, wherein each of the 3×3 blocks includes one of the single-photon-avalanche-diode pixel and eight of the color pixel groups.

(A8) In either of the imaging systems denoted as (A5) and (A6), the pixel array may be arranged with adjacent 2×2 blocks, wherein each of the 2×2 blocks includes one of the single-photon-avalanche-diode pixels and three of the color pixel groups.

(A9) In any of the imaging systems denoted as (A5) through (A8), the spatially shifted positions may include first positions that are shifted from each other by less than center-to-center spacing between nearest neighbor pairs of the single-photon-avalanche-diode pixels, such that resolution of the enhanced-resolution image exceeds resolution of the single-photon-avalanche-diode pixels within the pixel array.

(A10) In any of the imaging systems denoted as (A5) through (A9), the actuator may further be configured to place the image sensor at a plurality of spatially shifted second positions such that each pixel location that, in one of the spatially shifted second positions, is occupied by one of the single-photon-avalanche-diode pixels is, in at least one other one of the spatially shifted second positions, occupied by one of the color pixel groups, so as to enable composition of a complete color image, of the scene, free of gaps associated with the single-photon-avalanche-diode pixels.

(A11) In any of the imaging systems denoted as (A5) through (A10), the image sensor may include first circuitry for reading out the single-photon-avalanche-diode pixels at a first frame rate and second circuitry for reading out the color pixel groups at a second frame rate that is less than the first frame rate.

(A12) In any of the imaging systems denoted as (A1) through (A4), the pixel array may arrange the single-photon-avalanche-diode pixels in color pixel groups that each include at least one of each of a plurality of different types of the single-photon-avalanche-diode pixels sensitive to a respective plurality of different colors.

(A13) In the imaging system denoted as (A12), the different types of single-photon-avalanche-diode pixels may be (a) a first type sensitive to infrared light and (b) three different second types sensitive to three respective different colors of visual light, the spatially shifted positions including positions such that each pixel location that, in one of the spatially shifted positions, is occupied by one of the single-photon-avalanche-diode pixels sensitive to visual light is, in at least one other one of the spatially shifted positions, occupied by one of the single-photon-avalanche-diode pixels sensitive to infrared light, the enhanced-resolution image being an infrared image of greater resolution than resolution of the single-photon-avalanche-diode pixels sensitive to infrared light.

(B1) A method for capturing a plurality of first images that enable composition of an enhanced-resolution image of a scene may include (a) translating an image sensor parallel to light receiving surface of the image sensor, to place the image sensor at a plurality of spatially shifted positions, and (b) capturing, using single-photon-avalanche-diode pixels implemented in pixel array of the image sensor, the plurality of first images of the scene at the plurality of spatially shifted positions, respectively.

(B2) The method denoted as (B1) may further include composing the enhanced-resolution image from the first images.

(B3) The method denoted as (B2) may further include generating an enhanced-resolution image stream by performing several repetitions of the step of translating and, for each repetition of the step of translating, performing the step of capturing to generate the respective enhanced-resolution image and incorporating the enhanced-resolution image into the enhanced-resolution image stream.

(B4) In any of the methods denoted as (B1) through (B3), the pixel array may be composed of the single-photon-avalanche-diode pixels.

(B5) In the method denoted as (B4), the step of translating may include shifting the image sensor by less than distance between centers of neighboring single-photon-avalanche-diode pixels, such that the enhanced-resolution image has resolution greater than resolution of the pixel array.

(B6) In any of the methods denoted as (B1) through (B3), the pixel array may be composed of the single-photon-avalanche-diode pixels and color pixel groups of same size as the single-photon-avalanche-diode pixels, with the single-photon-avalanche-diode pixels being interspersed among the color pixel groups.

(B7) In the method denoted as (B6), the step of translating may include shifting the image sensor by less than distance between centers of nearest neighbor pairs of the single-photon-avalanche-diode pixels, such that resolution of the enhanced-resolution image exceeds resolution of the single-photon-avalanche-diode pixels within the pixel array.

(B8) In either of the methods denoted as (B6) and (B7), the step of capturing may further include capturing at least one color image of the scene using the color pixel groups.

(B9) In any of the methods denoted as (B6) through (B8), the step of translating may further include placing the image sensor at a plurality of spatially shifted second positions such that each pixel location that, in one of the spatially shifted second positions, is occupied by one of the single-photon-avalanche-diode pixels is, in at least one other one of the spatially shifted second positions, occupied by one of the color pixel groups, and the step of capturing may further include capturing a plurality of color images using the color pixel groups at the plurality of spatially shifted second positions, respectively, to enable composition of a complete color image, of the scene, free of gaps associated with the single-photon-avalanche-diode pixels.

(B10) In any of the methods denoted as (B6) through (B9), the step of capturing may include capturing the first images at frame rate higher than frame rate of the color images.

(B11) In any of the methods denoted as (B1) through (B5), the pixel array may arrange the single-photon-avalanche-diode pixels in color pixel groups, wherein each color pixel group includes at least one of each of a plurality of different types of the single-photon-avalanche-diode pixels sensitive to a respective plurality of different colors.

(B12) In the method denoted as (B11), the step of capturing may include capturing each of the first images as a color image to enable composition of an enhanced-resolution color image of the scene.

(B13) In any of the methods denoted as (B1) through (B5) and (B11), the pixel array may arrange the single-photon-avalanche-diode pixels in color pixel groups, wherein each color pixel group includes (a) a first type of single-photon-avalanche-diode pixels sensitive to infrared light and (b) three different second types of single-photon-avalanche-diode pixels sensitive to three respective different colors of visual light.

(B14) In the method denoted as (B13), the step of translating may include shifting the image sensor such that each pixel location that, in one of the spatially shifted positions, is occupied by one of the single-photon-avalanche-diode pixels sensitive to visual light is, in at least one other one of the spatially shifted positions, occupied by one of the single-photon-avalanche-diode pixels sensitive to infrared light to enable composition of an infrared image, of the scene, of greater resolution than resolution of the single-photon-avalanche-diode pixels sensitive to infrared light.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present system and method, which, as a matter of language, might be said to fall therebetween.

What is claimed is:

1. An imaging system with single-photon-avalanche-diodes and sensor translation for capturing a plurality of first images to enable generation of an enhanced-resolution image of a scene, comprising:
    an image sensor with a pixel array including single-photon-avalanche-diode pixels for capturing the plurality of first images of the scene at a plurality of spatially shifted positions of the image sensor, respectively; and
    an actuator for translating the image sensor, parallel to light receiving surface of the image sensor, to place the image sensor at the plurality of spatially shifted positions including positions that are shifted from each other by less than center-to-center spacing between nearest neighbor pairs of the single-photon-avalanche-diode pixels, such that resolution of the enhanced-resolution image exceeds resolution of the pixel array.

2. The imaging system of claim 1, further comprising a processing module for processing the plurality of first images to compose the enhanced-resolution image.

3. The imaging system of claim 1, the single-photon-avalanche-diode pixels forming all pixels of the pixel array.

4. The imaging system of claim 1, the pixel array further including color pixel groups for capturing a color image of the scene, each of the color pixel groups having a plurality of color-specific pixels sensitive to a respective plurality of different colors, the single-photon-avalanche-diode pixels being interspersed among the color pixel groups, each of the color-specific pixels being a CMOS or CCD pixel.

5. The imaging system of claim 4, each of the color pixel groups having same extent as each of the single-photon-avalanche-diode pixels.

6. The imaging system of claim 5, the pixel array being arranged with adjacent 3×3 blocks, each of the 3×3 blocks including one of the single-photon-avalanche-diode pixels and eight of the color pixel groups.

7. The imaging system of claim 5, the pixel array being arranged with adjacent 2×2 blocks, each of the 2×2 blocks including one of the single-photon-avalanche-diode pixels and three of the color pixel groups.

8. The imaging system of claim 5, the actuator being further configured to place the image sensor at a plurality of spatially shifted second positions such that each pixel location that, in one of the spatially shifted second positions, is occupied by one of the single-photon-avalanche-diode pixels is, in at least one other one of the spatially shifted second positions, occupied by one of the color pixel groups, so as to enable composition of a complete color image, of the scene, free of gaps associated with the single-photon-avalanche-diode pixels.

9. The imaging system of claim 4, the image sensor including first circuitry for reading out the single-photon-avalanche-diode pixels at a first frame rate and second circuitry for reading out the color pixel groups at a second frame rate that is less than the first frame rate.

10. The imaging system of claim 1, the pixel array arranging the single-photon-avalanche-diode pixels in color pixel groups that each include at least one of each of a plurality of different types of the single-photon-avalanche-diode pixels sensitive to a respective plurality of different colors.

11. The imaging system of claim 10, the different types of single-photon-avalanche-diode pixels being (a) a first type sensitive to infrared light and (b) three different second types sensitive to three respective different colors of visual light, the spatially shifted positions including positions such that each pixel location that, in one of the spatially shifted positions, is occupied by one of the single-photon-avalanche-diode pixels sensitive to visual light is, in at least one other one of the spatially shifted positions, occupied by one of the single-photon-avalanche-diode pixels sensitive to infrared light, the enhanced-resolution image being an infrared image of greater resolution than resolution of the single-photon-avalanche-diode pixels sensitive to infrared light.

12. A method for capturing a plurality of first images that enable composition of an enhanced-resolution image of a scene, comprising:
    translating an image sensor parallel to light receiving surface of the image sensor, to place the image sensor at a plurality of spatially shifted positions including positions that are shifted from each other by less than center-to-center spacing between nearest neighbor pairs of the single-photon-avalanche-diode pixels, such that resolution of the enhanced-resolution image exceeds resolution of the pixel array; and
    capturing, using single-photon-avalanche-diode pixels implemented in pixel array of the image sensor, the plurality of first images of the scene at the plurality of spatially shifted positions, respectively.

13. The method of claim 12, further comprising composing the enhanced-resolution image from the first images.

14. The method of claim 13, further comprising generating an enhanced-resolution image stream by:
    performing several repetitions of the step of translating; and
    for each repetition of the step of translating, performing the step of capturing to generate the respective enhanced-resolution image and incorporating the enhanced-resolution image into the enhanced-resolution image stream.

15. The method of claim 12, the pixel array being composed of the single-photon-avalanche-diode pixels and color pixel groups of same size as the single-photon-avalanche-diode pixels, the single-photon-avalanche-diode pixels being interspersed among the color pixel groups, each of the color pixel groups being a group of CMOS or CCD pixels.

16. The method of claim 15, the step of capturing further comprising capturing at least one color image of the scene using the color pixel groups.

17. The method of claim 15, further comprising:
    in the step of translating, placing the image sensor at a plurality of spatially shifted second positions such that each pixel location that, in one of the spatially shifted second positions, is occupied by one of the single-photon-avalanche-diode pixels is, in at least one other one of the spatially shifted second positions, occupied by one of the color pixel groups; and
    in the step of capturing, capturing a plurality of color images using the color pixel groups at the plurality of spatially shifted second positions, respectively, to enable composition of a complete color image, of the scene, free of gaps associated with the single-photon-avalanche-diode pixels.

18. The method of claim 15, the step of capturing comprising capturing the first images at frame rate higher than frame rate of the color images.

19. The method of claim 12, the pixel array arranging the single-photon-avalanche-diode pixels in color pixel groups, each color pixel group including at least one of each of a plurality of different types of the single-photon-avalanche-diode pixels sensitive to a respective plurality of different colors, the step of capturing comprising capturing each of the first images as a color image to enable composition of an enhanced-resolution color image of the scene.

20. The method of claim 12, the pixel array arranging the single-photon-avalanche-diode pixels in color pixel groups, each color pixel group including (a) a first type of single-photon-avalanche-diode pixels sensitive to infrared light and (b) three different second types of single-photon-avalanche-diode pixels sensitive to three respective different colors of visual light, the step of translation comprising shifting the image sensor such that each pixel location that, in one of the spatially shifted positions, is occupied by one of the single-photon-avalanche-diode pixels sensitive to visual light is, in at least one other one of the spatially shifted positions, occupied by one of the single-photon-avalanche-diode pixels sensitive to infrared light to enable composition of an infrared image, of the scene, of greater resolution than resolution of the single-photon-avalanche-diode pixels sensitive to infrared light.

* * * * *

UNITED STATES PATENT AND TRADEMARK OFFICE
CERTIFICATE OF CORRECTION

PATENT NO. : 9,628,735 B2  
APPLICATION NO. : 14/745954  
DATED : April 18, 2017  
INVENTOR(S) : Bowei Zhang et al.

Page 1 of 1

It is certified that error appears in the above-identified patent and that said Letters Patent is hereby corrected as shown below:

In the Claims

At Column 21, Line 19, delete "pairs of the" and insert --pairs of--;
Lines 19-21, delete ", such that resolution of the enhanced resolution image exceeds resolution of the pixel array" and insert --implemented in a pixel array of the image sensor--;
Line 22, delete "capturing, using single-photon-avalanche-diode" and insert --capturing, using the single-photon-avalanche-diode--;
Line 23, delete "implemented in pixel array of the image sensor";
Line 25, delete "respectively" and insert --respectively, such that resolution of the enhanced-resolution image exceeds resolution of the pixel array--.

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*